(12) United States Patent
Koike et al.

(10) Patent No.: US 7,915,794 B2
(45) Date of Patent: Mar. 29, 2011

(54) PIEZOELECTRIC DEVICE HAVING A TENSION STRESS, AND ANGULAR VELOCITY SENSOR

(75) Inventors: Nobuyuki Koike, Miyagi (JP); Takashi Tamura, Miyagi (JP)

(73) Assignee: Sony Corporation, Tokyo (JP)

( * ) Notice: Subject to any disclaimer, the term of this patent is extended or adjusted under 35 U.S.C. 154(b) by 245 days.

(21) Appl. No.: 12/252,886

(22) Filed: Oct. 16, 2008

(65) Prior Publication Data

US 2009/0127981 A1    May 21, 2009

(30) Foreign Application Priority Data

Nov. 15, 2007   (JP) ................... 2007-297321
Nov. 15, 2007   (JP) ................... 2007-297323
Nov. 15, 2007   (JP) ................... 2007-297325

(51) Int. Cl.
*H01L 41/04* (2006.01)
*H03H 9/21* (2006.01)

(52) U.S. Cl. ..................... 310/370; 73/504.02
(58) Field of Classification Search ................ 310/370; 73/504.12–504.15
See application file for complete search history.

(56) References Cited

U.S. PATENT DOCUMENTS

| 7,185,540 B2 * | 3/2007 | Torii et al. ............. 310/370 |
| 2006/0187272 A1 * | 8/2006 | Torii et al. ............. 73/514.34 |

FOREIGN PATENT DOCUMENTS

| JP | 04-082309 | 3/1992 |
| JP | 06-350154 | 12/1994 |
| JP | 09-298324 | 11/1997 |
| JP | 2001-088301 | 4/2001 |
| JP | 2003-023187 | 1/2003 |
| JP | 2003-212545 | 7/2003 |
| JP | 2004-047928 | 2/2004 |
| JP | 2004-080020 | 3/2004 |
| JP | 2004-282913 | 10/2004 |
| JP | 2005-333088 | 12/2005 |
| JP | 2005-340631 | 12/2005 |
| JP | 2006-147839 | 6/2006 |
| JP | 2007-123683 | 5/2007 |
| JP | 2007-250626 | 9/2009 |
| WO | 2005-030673 | 4/2005 |

OTHER PUBLICATIONS

Japanese Office Action (2007-297325) issued on Dec. 1, 2009.
Japanese Office Action (2007-297323) issued on Dec. 1, 2009.
Japanese Office Action (2007-297321) issued on Dec. 1, 2009.

* cited by examiner

*Primary Examiner* — J. SanMartin
(74) *Attorney, Agent, or Firm* — K&L Gates LLP

(57) ABSTRACT

A piezoelectric device includes a piezoelectric film and an electrode film. The piezoelectric film is constituted of lead zirconium titanate represented by $Pb_{1+X}(Zr_YTi_{1-Y})O_{3+X}$, where X is 0 or more and 0.3 or less and Y is 0 or more and 0.55 or less, the piezoelectric film having a tension stress. The electrode film applies a voltage to the piezoelectric film.

15 Claims, 11 Drawing Sheets

PIEZOELECTRIC DEVICE HAVING A TENSION STRESS, AND ANGULAR VELOCITY SENSOR

CROSS REFERENCES TO RELATED APPLICATIONS

The present application claims priority to Japanese Patent Application JP 2007-297321 filed in the Japanese Patent Office on Nov. 15, 2007, Japanese Patent Application JP 2007-297323 filed in the Japanese Patent Office on Nov. 15, 2007, and Japanese Patent Application JP 2007-297325 filed in the Japanese Patent Office on Nov. 15, 2007, the entire contents of which are being incorporated herein by reference.

BACKGROUND

The present application relates to a piezoelectric device used in a piezoelectric sensor, a piezoelectric actuator, and a pyroelectric infrared ray sensor, an angular velocity sensor including the piezoelectric device, and a method of manufacturing a piezoelectric device.

From the past, lead zirconium titanate ($Pb_{1+X}(Zr_YT_{1-Y})O_{3+X}$) (hereinafter, referred to as PZT) is used as a piezoelectric material of a piezoelectric thin film used for a piezoelectric sensor such as an angular velocity sensor, an ink jet head, and the like. Various techniques are proposed for improving piezoelectric characteristics, ferromagnetic material characteristics, pyroelectric characteristics, and the like of the PZT (see, for example, Japanese Patent Application Laid-open No. Hei 06-350154 (paragraphs (0030) to (0044), (0060) to (0073), FIGS. 3, 4, etc.) and Japanese Patent Application Laid-open No. Hei 09-298324 (paragraphs (0007) to (0009), FIG. 5); hereinafter, will respectively be referred to as Patent Document 1 and Patent Document 2).

Patent Document 1 discloses a PZT thin film whose crystalline structure is rhombohedral, in which, when lead zirconium titanate is represented by $Pb_{1+Y}(Zr_XT_{1-X})O_{3+Y}$, a PbO excessive composition ratio Y is within a range of $0 \leq Y \leq 0.5$, and a Zr composition ratio X is within a range of $0 \leq Y \leq 0.55$. The PZT thin film of Patent Document 1 exhibits favorable piezoelectric characteristics. Moreover, there is also disclosed a PZT thin film whose crystalline structure is tetragonal, in which the PbO excessive composition ratio Y is within a range of $0 \leq Y < 0.5$, and the Zr composition ratio X is within a range of $0.55 \leq X < 1$.

Patent Document 2 discloses a piezoelectric thin film having a thickness of 1 µm or more and 10 µm or less, a crystal grain size of 0.55 µm or less, and surface roughness of 1 µm or less at $R_{MAX}$. The piezoelectric thin film is useful as a piezoelectric thin film for an ink-jet-type storage apparatus that requires a predetermined film thickness or more.

SUMMARY

Incidentally, when heated, the piezoelectric material is known to deteriorate in piezoelectric performance, which is called depolarization. However, because heating processing by solder reflow and the like is generally carried out in a process of manufacturing an electronic apparatus that includes the piezoelectric material, there is a problem that the piezoelectric performance of the piezoelectric material deteriorates due to the heat.

Particularly in recent years, a solder reflow temperature is increasing due to lead-free soldering in consideration of environmental problems, and heat caused by the solder reflow causes the piezoelectric performance of the piezoelectric material to deteriorate, which is problematic. However, Patent Documents 1 and 2 above give no consideration to the effect of heat.

Further, there is a problem that when the piezoelectric member is to have a film thickness of 1 µm or more as described in Patent Document 2, a possibility of cracks being caused or crystallinity being deteriorated increases. The deterioration of the crystallinity may also become a cause of the depolarization due to the heating processing.

In view of the above circumstances, there is a need for a piezoelectric device excellent in piezoelectric characteristics and heat resistance, an angular velocity sensor including the piezoelectric device, and a method of manufacturing a piezoelectric device.

According to an embodiment, there is provided a piezoelectric device including a piezoelectric film and an electrode film. The piezoelectric film is constituted of lead zirconium titanate represented by $Pb_{1+X}(Zr_YTi_{1-Y})O_{3+X}$, where X is 0 or more and 0.3 or less and Y is 0 or more and 0.55 or less, the piezoelectric film having a tension stress. The electrode film applies a voltage to the piezoelectric film.

By setting a PbO excessive composition ratio X of the PZT to be 0 or more and 0.3 or less and a Zr composition ratio Y to be 0 or more and 0.55 or less, a piezoelectric device excellent in piezoelectric characteristics can be obtained. If the Zr composition ratio Y is 0 or more and 0.55 or less, depolarization hardly occurs and excellent heat resistance can be obtained.

In addition, by providing the tension stress to the piezoelectric film, a piezoelectric device with additionally-improved heat resistance can be obtained.

In the piezoelectric device according to an embodiment, the tension stress of the piezoelectric film may be 50 MPa or more and 500 MPa or less. Accordingly, a piezoelectric device with additionally-improved heat resistance can be obtained.

In the piezoelectric device according to an embodiment, the piezoelectric film may have a film thickness of 400 nm or more and 1,000 nm or less.

Accordingly, a piezoelectric device with additionally-improved piezoelectric characteristics can be obtained.

In the piezoelectric device according to an embodiment, the electrode film may have a tension stress of 500 MPa or more and 1,500 MPa or less.

Accordingly, a piezoelectric device with additionally-improved heat resistance can be obtained.

In the piezoelectric device according to an embodiment, the piezoelectric film may have an orientation of 80% or more in a <111> direction.

Accordingly, a piezoelectric device with additionally-improved heat resistance can be obtained.

In the piezoelectric device according to an embodiment, the piezoelectric film may include at least one of additive elements selected from the group consisting of Cr, Mn, Fe, Ni, Mg, Sn, Cu, Ag, Nb, Sb, and N.

In the piezoelectric device according to an embodiment, the electrode film may be formed of at least one of Ti and Pt. The electrode film may also be formed of Ir, Au, and Ru, or oxides of Ti, Pt, Ir, Au, and Ru.

According to another embodiment, there is provided a piezoelectric device including a piezoelectric film and an electrode film. The piezoelectric film is constituted of lead zirconium titanate represented by $Pb_{1+X}(Zr_YTi_{1-Y})O_{3+X}$, where X is 0 or more and 0.3 or less and Y is 0 or more and 0.55 or less. The electrode film has a tension stress of 500 MPa or more and 1,500 MPa or less and applies a voltage to the piezoelectric film.

By setting the PbO excessive composition ratio X of the PZT to be 0 or more and 0.3 or less and the Zr composition ratio Y to be 0 or more and 0.55 or less, a piezoelectric device excellent in piezoelectric characteristics can be obtained. If the Zr composition ratio Y is 0 or more and 0.55 or less, depolarization hardly occurs and excellent heat resistance can be obtained.

In addition, by providing the tension stress of 500 MPa or more and 1,500 MPa or less to the electrode film, a piezoelectric device with additionally-improved heat resistance can be obtained.

In the piezoelectric device according to an embodiment, the piezoelectric film may have a film thickness of 400 nm or more and 1,000 nm or less.

Accordingly, a piezoelectric device with additionally-improved piezoelectric characteristics can be obtained.

In the piezoelectric device according to an embodiment, the piezoelectric film may have a tension stress of 50 MPa or more and 500 MPa or less.

Accordingly, a piezoelectric device with additionally-improved heat resistance can be obtained.

In the piezoelectric device according to an embodiment, the piezoelectric film may have an orientation of 80% or more in a <111> direction.

Accordingly, a piezoelectric device with additionally-improved heat resistance can be obtained.

In the piezoelectric device according to an embodiment, the piezoelectric film may include at least one of additive elements selected from the group consisting of Cr, Mn, Fe, Ni, Mg, Sn, Cu, Ag, Nb, Sb, and N.

In the piezoelectric device according to an embodiment, the electrode film may be formed of at least one of Ti and Pt. The electrode film may also be formed of Ir, Au, and Ru, or oxides of Ti, Pt, Ir, Au, and Ru.

According to another embodiment, there is provided a piezoelectric device including a piezoelectric film and an electrode film. The piezoelectric film is constituted of lead zirconium titanate represented by $Pb_{1+X}(Zr_Y Ti_{1-Y})O_{3+X}$, where X is 0 or more and 0.3 or less and Y is 0 or more and 0.55 or less, the piezoelectric film having a film thickness of 400 nm or more and 1,000 nm or less. The electrode film applies a voltage to the piezoelectric film.

By setting the PbO excessive composition ratio X of the PZT to be 0 or more and 0.3 or less and the Zr composition ratio Y to be 0 or more and 0.55 or less, a piezoelectric device excellent in piezoelectric characteristics can be obtained. If the Zr composition ratio Y is 0 or more and 0.55 or less, depolarization hardly occurs and excellent heat resistance can be obtained.

In addition, by setting the film thickness to be 400 nm or more and 1,000 nm or less, a piezoelectric device with additionally-improved piezoelectric characteristics can be obtained.

In the piezoelectric device according to an embodiment, the piezoelectric film may have an orientation of 80% or more in a <111> direction.

Accordingly, a piezoelectric device with additionally-improved heat resistance can be obtained.

In the piezoelectric device according to an embodiment, the piezoelectric film may include at least one of additive elements selected from the group consisting of Cr, Mn, Fe, Ni, Mg, Sn, Cu, Ag, Nb, Sb, and N.

In the piezoelectric device according to an embodiment, the electrode film may be formed of at least one of Ti and Pt. The electrode film may also be formed of Ir, Au, and Ru, or oxides of Ti, Pt, Ir, Au, and Ru.

According to another embodiment, there is provided an angular velocity sensor including a substrate, a first electrode film, a piezoelectric film, and a second electrode film. The first electrode film is formed on the substrate. The piezoelectric film is constituted of lead zirconium titanate represented by $Pb_{1+X}(Zr_Y Ti_{1-Y})O_{3+X}$, where X is 0 or more and 0.3 or less and Y is 0 or more and 0.55 or less, the piezoelectric film having a tension stress and formed on the first electrode film. The second electrode film is formed on the piezoelectric film.

According to another embodiment, there is provided an angular velocity sensor including a substrate, a first electrode film, a piezoelectric film, and a second electrode film. The first electrode film has a tension stress of 500 MPa or more and 1,500 MPa or less and is formed on the substrate. The piezoelectric film is constituted of lead zirconium titanate represented by $Pb_{1+X}(Zr_Y Ti_{1-Y})O_{3+X}$, where X is 0 or more and 0.3 or less and Y is 0 or more and 0.55 or less, the piezoelectric film formed on the first electrode film. The second electrode film is formed on the piezoelectric film.

According to another embodiment, there is provided an angular velocity sensor including a substrate, a first electrode film, a piezoelectric film, and a second electrode film. The first electrode film is formed on the substrate. The piezoelectric film is constituted of lead zirconium titanate represented by $Pb_{1+X}(Zr_Y Ti_{1-Y})O_{3+X}$, where X is 0 or more and 0.3 or less and Y is 0 or more and 0.55 or less, the piezoelectric film having a film thickness of 400 nm or more and 1,000 nm or less and formed on the first electrode film. The second electrode film is formed on the piezoelectric film.

According to an embodiment, a piezoelectric device excellent in piezoelectric characteristics and heat resistance, an angular velocity sensor including the piezoelectric device, and a method of manufacturing a piezoelectric device can be provided.

Additional features and advantages are described herein, and will be apparent from the following Detailed Description and the figures.

DETAILED DESCRIPTION

Figure 1A:
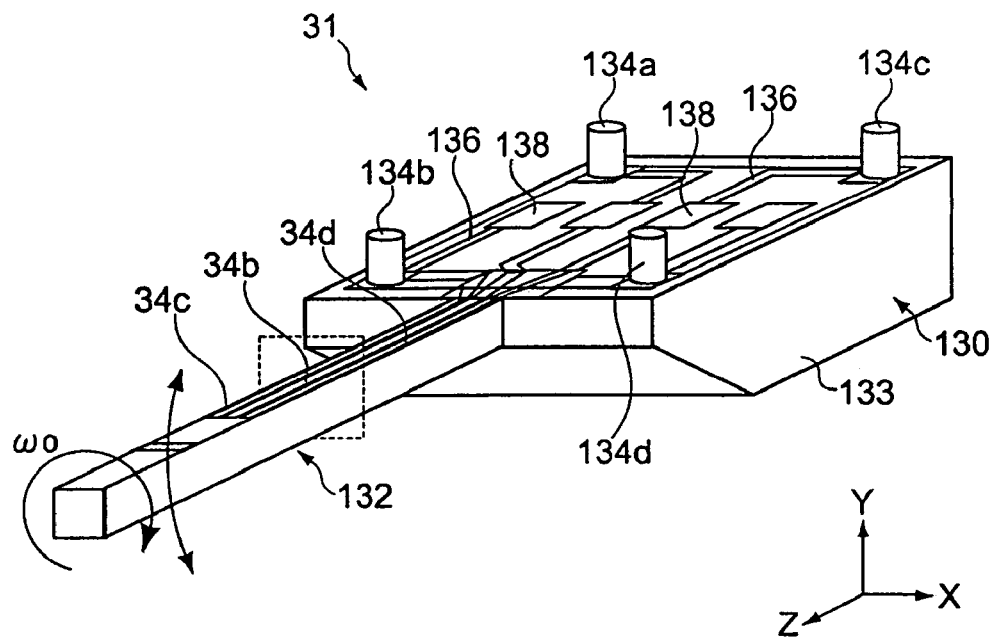
FIG. 1 are diagrams showing a piezoelectric device and an angular velocity sensor including the piezoelectric device according to a first embodiment.

An embodiment will be described with reference to the drawings.

First Embodiment

A first embodiment will be described. FIG. 1 are diagrams showing a piezoelectric device and an angular velocity sensor including the piezoelectric device according to the first embodiment.

An angular velocity sensor 31 includes a base body 130 and a vibration arm 132 that extends from the base body 130 and is capable of vibrating. FIG. 1B is a cross-sectional diagram of a surface vertical to a longitudinal axis (Z axis) of the vibration arm 132.

The angular velocity sensor 31 includes a semiconductor arm base 133 made of, for example, silicon, and a piezoelectric device 139 disposed on the arm base 133. As shown in FIG. 1B, for example, a first electrode film 34a as a common electrode is laminated on a silicon substrate, and a piezoelectric film 33 is laminated on the first electrode film 34a. On a first surface 33a as an upper surface of the piezoelectric film 33, a second electrode film 34b, a first detection electrode 34c, and a second detection electrode 34d each having a predetermined elongated shape are formed.

Also on the base body 130, a lead electrode including lead wires 136, electrode pads 138, bumps 134a to 134d, and the like is formed. The bump 134a is connected to the second electrode film 34b, the bumps 134b and 134c are respectively connected to the first detection electrode 34c and the second detection electrode 34d, and the bump 134d is connected to the first electrode film 34a. An external connection to a control circuit (not shown) such as an IC is made via the bumps 134a to 134d. The bumps 134a to 134d are each formed of metal, for example, but are not limited thereto.

Figure 1B:
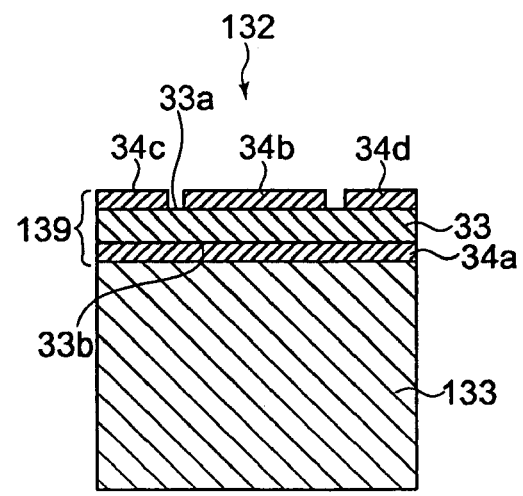

After the first electrode film 34a, the second electrode film 34b, the first detection electrode 34c, the second detection electrode 34d, the lead wires 136, and the like are formed as described above, the angular velocity sensor 31 of a shape as shown in FIG. 1A is cut out from a silicon wafer.

Next, a typical example of an operation of the angular velocity sensor 31 will be described.

The first electrode film 34a of the piezoelectric device 139 is connected to a DC power supply, and an AC power supply is connected between a first electrode film 34a and the second electrode film 34b. Accordingly, a voltage is applied to the piezoelectric film 33 disposed between the first electrode film 34a and the second electrode film 34b so that the vibration arm 132 is caused of a flexion movement in a vertical direction (Y direction).

When an angular velocity $\omega_0$ is applied to the vibration arm 132 during the flexion movement, Coriolis force is generated in the vibration arm 132. The Coriolis force is generated in a direction vertical (X direction) to a direction of the flexion movement of the vibration arm 132 (Y direction), a magnitude of which is proportional to a value of the applied angular velocity $\omega_0$. The Coriolis force is converted into an electric signal by the piezoelectric film 33, and the converted signal is detected by the first detection electrode 34c and the second detection electrode 34d.

Next, piezoelectric performance and heat resistance performance of the piezoelectric device 139 will be described while describing a method of manufacturing the angular velocity sensor 31. It should be noted that descriptions will mainly be given on a method of forming the piezoelectric device 139 formed on the arm base 133.

First, a silicon wafer is prepared. An oxidation protection film may be formed on the silicon wafer by thermal oxidation processing.

The first electrode film 34a is formed by depositing Ti of 30 nm on the silicon wafer by a sputtering method, and then depositing Pt of 100 nm thereon, for example. The deposition method of the first electrode film 34a is not limited to the sputtering method, and a vacuum vapor deposition method or other deposition methods may be used. Moreover, the metal materials that constitute the first electrode film 34a are not limited to Ti and Pt, and examples thereof include Ir, Au, and Ru, or oxides of Ti, Pt, Ir, Au, and Ru. The second electrode film 34b may also be constituted of those metal materials.

Subsequently, the piezoelectric film 33 is formed by forming a PZT thin film on the first electrode film 34a by, for example, the sputtering method. The deposition method of the piezoelectric film 33 is not limited to the sputtering method, and deposition methods such as a vacuum vapor deposition method, a PLD (pulsed laser deposition) method, a sol-gel method, an aerosol deposition method, and the like may be used. A substrate temperature when depositing the PZT thin film 33 may either be at room temperature or at a high temperature.

In the deposition of the PZT thin film 33, a PbO excessive composition ratio X is set to be −0.1 or more and 0.5 or less, and a Zr composition ratio Y is set to be 0.35 or more and 0.65 or less. For realizing such a PZT composition ratio, a target composition, sputtering conditions, annealing conditions, and the like are set appropriately. For increasing a perovskite structure of the PZT after the PZT thin film 33 is formed on the first electrode film 34a, heating processing at 700°, for example, may be carried out on the PZT thin film 33. A crystalline structure of the PZT thin film 33 in this case is tetragonal.

A film thickness of the PZT thin film 33 formed as described above is 100 nm to 1,400 nm.

After the PZT thin film 33 is formed, Pt of 200 nm is deposited on the PZT thin film 33 by the sputtering method to thus form the second electrode film 34b. The deposition method of the second electrode film 34b in this case is not limited to the sputtering method, and a vacuum vapor deposition method or other deposition methods may be used.

Next, a voltage is applied between the first electrode film 34a and the second electrode film 34b in an atmosphere heated to 240°, and polarization processing is carried out on the PZT thin film 33. The voltage applied between the first electrode film 34a and the second electrode film 34b is 1 to 20-times as large as a coercive electric field $E_c$. Moreover, a polarization temperature in the polarization processing is, compared to a Curie temperature, $\frac{1}{16}$ to $\frac{5}{4}$ the Curie temperature. It should be noted that the polarization processing may be carried out in any of an atmosphere, an oxygen atmosphere, and a nitrogen atmosphere.

After the polarization processing, prebake processing is carried out on the deposited PZT thin film 33. A prebake temperature of the prebake processing is $\frac{1}{2}$ to $\frac{5}{4}$ the Curie temperature.

The PZT thin film 33 described above may have a tension stress. For providing the tension stress to the PZT thin film 33, the PZT thin film 33 may be subjected to heating processing at, for example, 650° C. to 750° C. after being formed on the first electrode film 34a. Accordingly, crystallization of the PZT thin film 33 is accelerated, thus obtaining the tension stress. In addition, in this case, the target composition, the sputtering conditions, the annealing conditions, and the like are set appropriately such that the PbO excessive composition ratio X of the PZT becomes 0.04, the Zr composition ratio Y thereof becomes 0.35 to 0.65, and the tension stress becomes −100 MPa to 600 MPa, for example.

Further, the first electrode film 34a described above may also have the tension stress. For providing the tension stress to the first electrode film 34a, the first electrode film 34a may be subjected to the heating processing at, for example, 100° C. to 800° C. after the PZT thin film 33 is formed thereon. Alternatively, it is also possible to provide the tension stress to the first electrode film 34a by the heating processing carried out during deposition instead of after the deposition of the first electrode film 34a and the PZT thin film 33. By changing deposition conditions, heating processing conditions, and the like, a tension stress of a wide range can be provided to the first electrode film 34a. The tension stress of the first electrode film 34a formed as described above is −200 MPa to 2,000 MPa.

(Evaluation of Piezoelectric Characteristics)

Next, descriptions will be given on piezoelectric characteristics of the piezoelectric device 139 thus formed on the silicon wafer.

Figure 2:
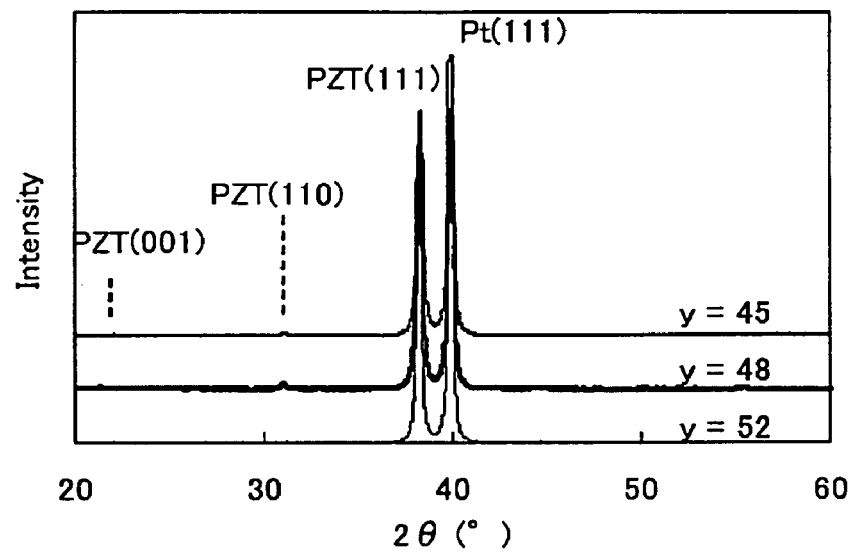
FIG. 2 is a diagram showing an XRD (X-ray diffraction) pattern of a PZT thin film.

FIG. 2 is a diagram showing an XRD (X-ray diffraction) pattern of the PZT thin film 33. The PZT is oriented to a <111> surface and has an orientation degree of 97%. In FIG. 2, the film thickness of the PZT thin film 33 whose XRD pattern has been measured is 900 nm, the voltage used in the polarization processing is 6-times the coercive electric field, and the polarization temperature is 240° C. In addition, the prebake temperature is 200° C. for 100 s.

It should be noted that in the following descriptions made on the figures, unless specified otherwise, the film thickness of the PZT thin film 33 is 900 nm.

Figure 3:
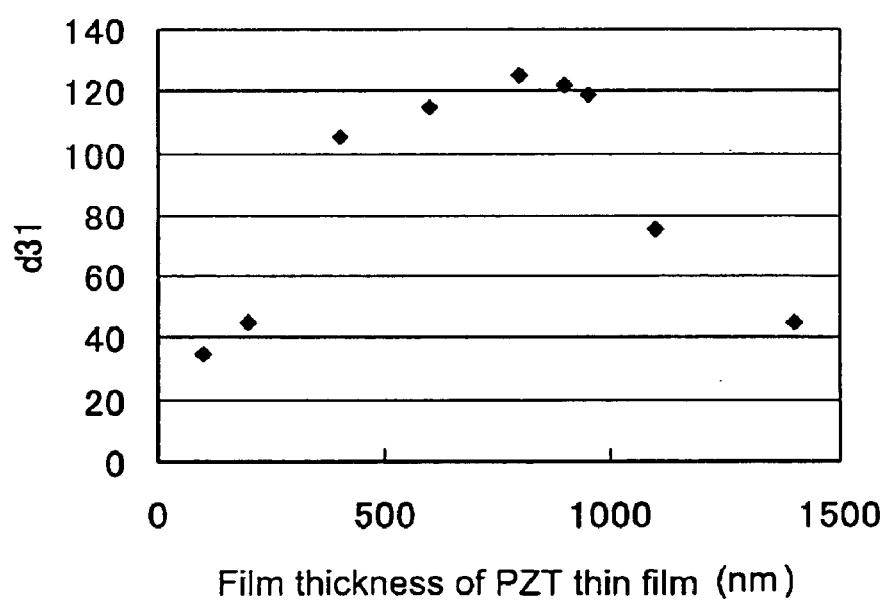
FIG. 3 is a diagram showing a relationship between a film thickness (100 nm to 1,400 nm) of the PZT thin film and a piezoelectric constant d31.

FIG. 3 is a diagram showing a relationship between the film thickness (100 nm to 1,400 nm) of the PZT thin film 33 and a piezoelectric constant d31. As shown in FIG. 3, the PZT thin film 33 shows favorable piezoelectric characteristics when the film thickness is 400 nm to 1,000 nm. Consequently, piezoelectric characteristics sufficient for the piezoelectric device 139 of the angular velocity sensor 31 can be obtained when the film thickness is within the range of 400 nm to 1,000 nm.

The piezoelectric constant d31 decreases when the film thickness of the PZT thin film 33 is 1,000 nm or more. This is probably because when the film thickness is 1,000 nm or more, crystals grow in a direction other than the <111> surface direction, such as a <001> surface direction, and thus a peak intensity in the <111> surface direction is saturated. Therefore, by setting the film thickness of the PZT thin film 33 to be less than 1,000 nm, peak growths in directions other than the <111> surface direction can be suppressed. It should be noted that a main peak of a crystal mainly contributes to the piezoelectric characteristics.

Meanwhile, the film thickness of less than 400 nm leads to an increase in leak current, whereby it becomes difficult to obtain piezoelectric characteristics sufficient for the piezoelectric device 139.

Figure 4:
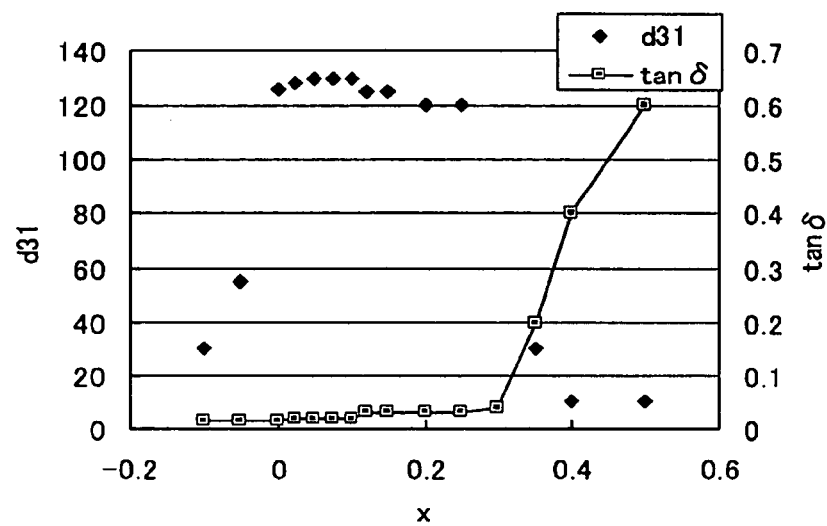
FIG. 4 is a diagram showing relationships of a PbO excessive composition ratio X (−0.1 to 0.5) of the PZT thin film with the piezoelectric constant d31 and a loss rate tan δ.

FIG. 4 is a diagram showing relationships of the PbO excessive composition ratio X (−0.1 to 0.5) of the PZT thin film 33 with the piezoelectric constant d31 and a loss rate tan δ. The orientation degree of the PZT thin film 33 in the <111> surface direction is 80% or more and less than 100%, and the Zr composition ratio Y is 0.5.

It can be seen from FIG. 4 that the piezoelectric constant d31 and the loss rate tan δ are both favorable when the PbO excessive composition ratio X is within the range of 0 to 0.3. The piezoelectric characteristics deteriorate when the PbO excessive composition ratio X is less than 0. This is probably because PZT crystallinity deteriorates when the PbO excessive composition ratio X is small. On the other hand, the loss rate tan δ increases and the piezoelectric characteristics deteriorate when the PbO excessive composition ratio X is 0.3 or more. This is probably because an insulation property of the PZT thin film 33 deteriorates when the PbO excessive composition ratio X is large, thus resulting in a decrease in piezoelectric characteristics.

Figure 5:
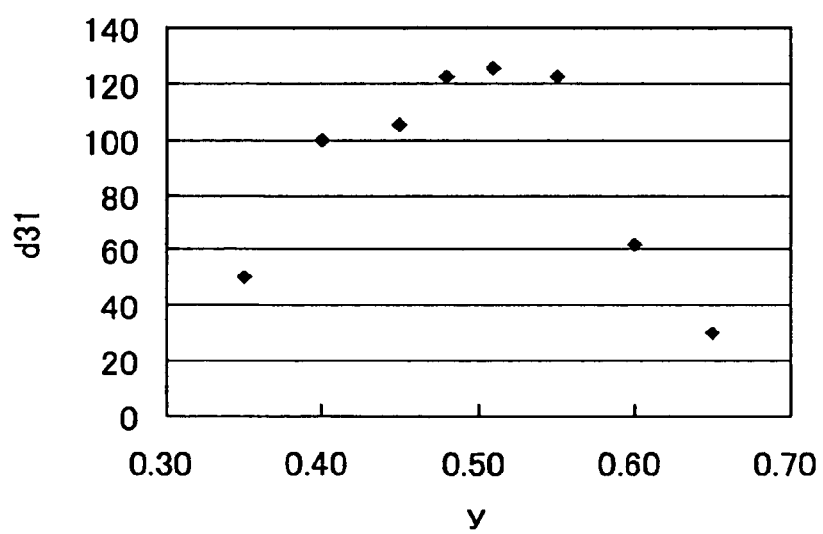
FIG. 5 is a diagram showing a relationship between a Zr composition ratio Y (0.35 to 0.65) of the PZT thin film and the piezoelectric constant d31.

FIG. 5 is a diagram showing a relationship between the Zr composition ratio Y (0.35 to 0.65) of the PZT thin film 33 and the piezoelectric constant d31. As shown in FIG. 5, the PZT thin film 33 shows maximum piezoelectric characteristics when the Zr composition ratio Y is 0.51 and favorable piezoelectric characteristics when the Zr composition ratio Y is 0.4 or more and 0.55 or less. As long as the Zr composition ratio Y is 0.4 or more and 0.55 or less, piezoelectric characteristics sufficient for the piezoelectric device 139 of the angular velocity sensor 31 can be obtained.

Incidentally, it is known that a bulk PZT shows favorable piezoelectric characteristics when the Zr composition ratio Y thereof is 0.5 or more and 0.53 or less. However, the piezoelectric characteristics of the bulk PZT deteriorate precipitously when the Zr composition ratio Y becomes less than 0.5. On the other hand, as shown in FIG. 5, the PZT thin film deposited by, for example, the sputtering method shows favorable piezoelectric characteristics even when the Zr composition ratio Y is 0.4 or more and 0.5 or less.

(Evaluation of Heat Resistance)

Next, an evaluation on the heat resistance will be described, but first, descriptions will be given on a method of evaluating heat resistance.

The angular velocity sensor 31 of a shape as shown in FIG. 1A is cut out from the silicon wafer on which the piezoelectric device 139 including the first electrode film 34a, the PZT thin film 33, and second electrode film 34b, the lead wires 136, and the like are formed. An MEMS (Micro Electro Mechanical Systems) technique is typically used for the cutout from the silicon wafer. It should be noted that length, width, and thickness of the vibration arm 132 are, for example, 2,000 μm, 150 μm, and 150 μm, respectively.

The heat resistance is evaluated by measuring an amplitude of the vibration arm 132 of the thus-formed angular velocity sensor 31 in the Y direction. Specifically, the heat resistance of the piezoelectric device 139 is evaluated by measuring the amplitude of the vibration arm 132 in the Y direction, applying to the PZT thin film 33 heat that takes into account the heating processing carried out at the time of manufacturing the device, such as solder reflow, and re-measuring the amplitude of the vibration arm 132 in the Y direction thereafter. It should be noted that the heat applied to the PZT thin film 33 is, considering the heating processing at the time of manufacturing the device, 180° C. to 300° C., and a heating time thereof is 30 s to 300 s. In addition, the voltage applied between the first electrode film 34a and second electrode film 34b is an AC voltage of, for example, 1 kHz, 1V.

Figure 6:
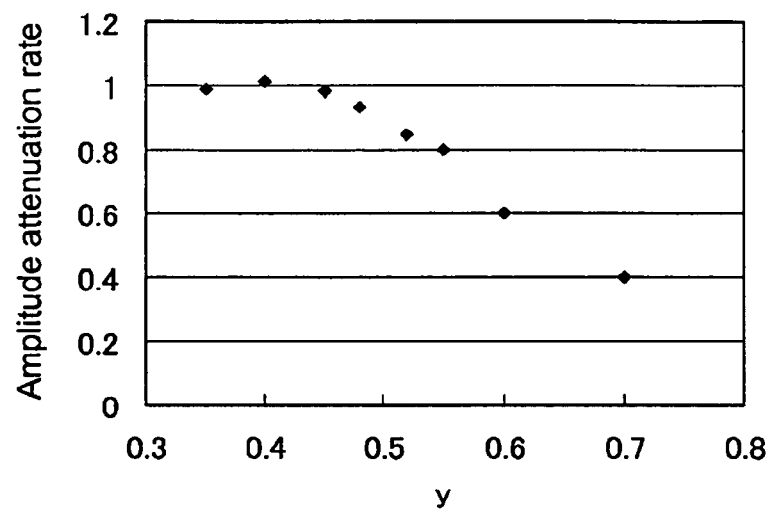
FIG. 6 is a diagram showing a relationship between the Zr composition ratio Y (0.35 to 0.7) of the PZT thin film and an attenuation rate of a vibration arm after application of heat.

FIG. 6 is a diagram showing a relationship between the Zr composition ratio Y (0.35 to 0.7) of the PZT thin film 33 and an attenuation rate of the vibration arm 132 after application of heat. The heating temperature and the heating time are 240° C. and 90 s, respectively.

It can be seen from FIG. 6 that attenuation of the amplitude of the vibration arm 132 after application of heat increases when the Zr composition ratio Y exceeds 0.55, whereas the attenuation thereof is hardly observed when the Zr composition ratio Y is 0.55 or less. In other words, the PZT thin film 33 with the Zr composition ratio Y of 0.55 or less has excellent heat resistance.

Figure 7:
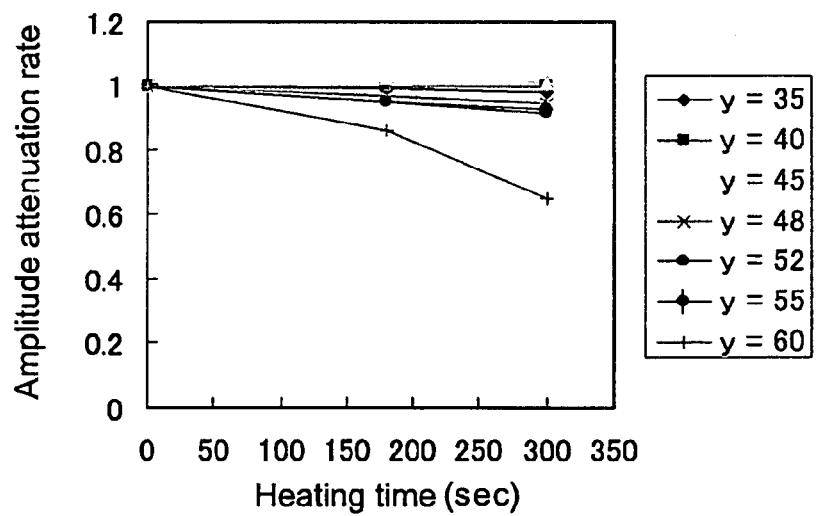
FIG. 7 is a diagram showing a relationship between a heating time and the amplitude attenuation rate after application of heat in a case where a heating temperature is set to 240°.

FIG. 7 is a diagram showing a relationship between the heating time and the amplitude attenuation rate after application of heat in a case where the heating temperature is set to 240°. The Zr composition ratio Y of the PZT thin film 33 is within the range of 0.35 to 0.60. It can be seen from FIG. 7 that when the Zr composition ratio Y is 0.55 or less, the amplitude attenuation after application of heat hardly occurs even when the heating time is extended, which implies excellent heat resistance.

Figure 8:
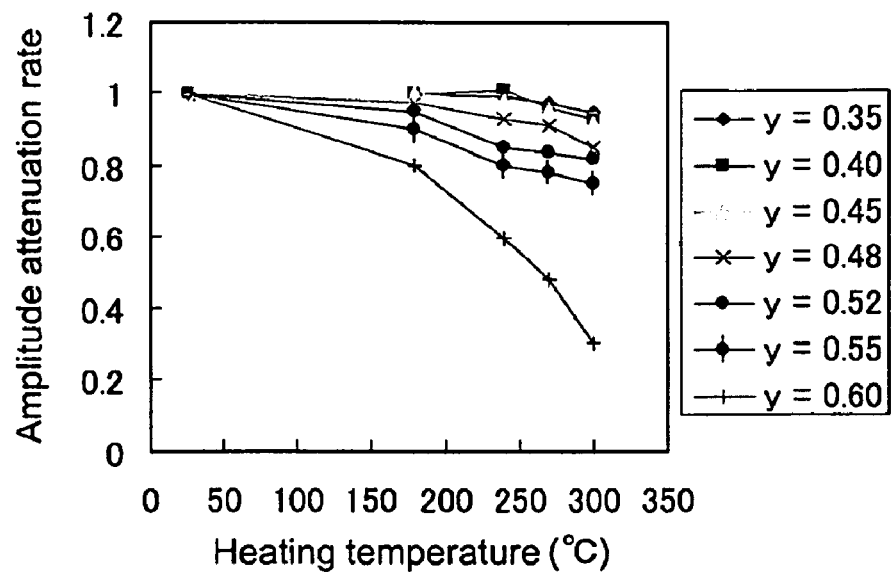
FIG. 8 is a diagram showing a relationship between the heating temperature and the amplitude attenuation rate after application of heat.

FIG. 8 is a diagram showing a relationship between the heating temperature and the amplitude attenuation rate after application of heat. The Zr composition ratio Y of the PZT thin film 33 is within the range of 0.35 to 0.60. It can be seen from FIG. 8 that when the Zr composition ratio Y is 0.55 or less, the amplitude attenuation after application of heat hardly occurs even when the heating temperature is increased, which implies excellent heat resistance.

Figure 9:
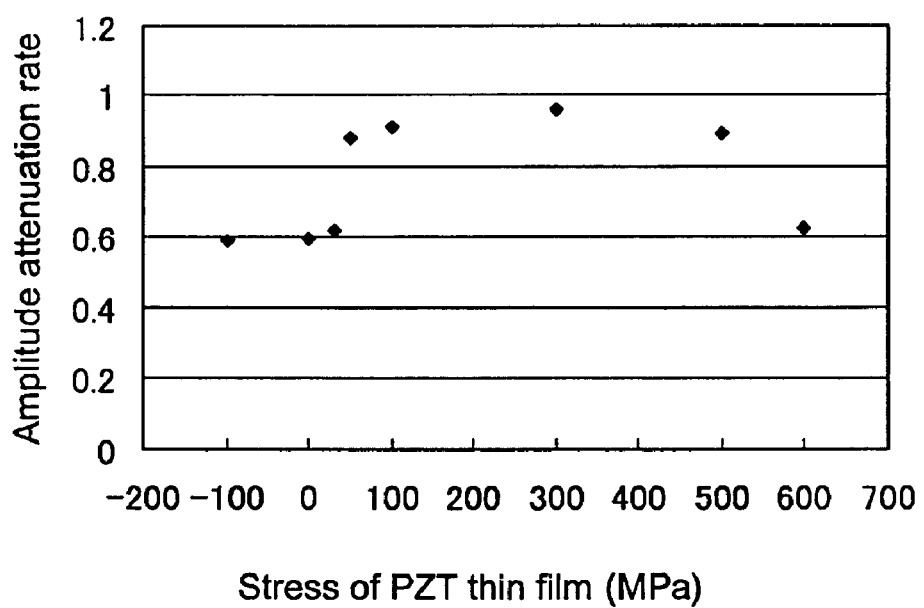
FIG. 9 is a diagram showing a relationship between a stress (−100 MPa to 600 MPa) of the PZT thin film and the amplitude attenuation rate after application of heat.

FIG. 9 is a diagram showing a relationship between a stress (−100 MPa to 600 MPa) of the PZT thin film 33 and the amplitude attenuation rate after application of heat. In this case, the tension stress of the first electrode film 34a is 1,000 MPa. In addition, the heating temperature and heating time of the PZT thin film 33 are 240° C. and 90 s, respectively. It should be noted that in FIG. 9, a stress of a positive value represents a tension stress, and a stress of a negative value represents a compression stress.

Now, a method of measuring a stress of the PZT thin film 33 will be described. An X-ray reciprocal lattice map measurement method is used as the method of measuring a stress of the PZT thin film 33, and an X-ray diffraction apparatus X'pert PRO MRD (registered trademark) from PANalytical (registered trademark) is used as a measurement apparatus therefor. In the reciprocal lattice map technique, a measurement target sample is tilted about a φ axis orthogonal to a θ axis, and diffraction from a crystal surface of the sample is detected. Identification of the measurement target sample is made based on the detected diffraction peak.

For example, in a case where there is no distortion or stress in the crystal of the measurement target sample, no change in diffraction angle occurs at any φ angle regarding a main orientation peak of the PZT <111> diffraction (in the vicinity of (2θ, φ)=(38°, 0°), (2θ, φ)=(38°, 70°)). However, in a case where there is a tension stress in the measurement target sample, the diffraction angle when φ=70° shifts more on a low-angle side than the diffraction angle when φ=0. On the other hand, in a case where there is a compression stress in the measurement target sample, the diffraction angle when φ=70° shifts more on a wide-angle side than the diffraction angle when φ=0. By evaluating a magnitude of the shift, it is possible to measure the stress of the PZT thin film 33.

The method of measuring a stress of the PZT thin film 33 is not limited to the X-ray reciprocal lattice map measurement method, and other methods may be used instead. For example, as described in the following reference, a value of the stress may be evaluated by using Stoney Expression after measuring a warpage of a substrate on which a film is deposited (reference: "Basics and Application of Thin Films by a Plasma Process", Hiroshi Ichimura, Masaru Ikenaga, THE NIKKAN KOGYO SHIMBUN, LTD., 2005). For measuring Young's modulus necessary for derivation of a stress, a nanoindentation method is used as described in the reference, for example. The X-ray reciprocal lattice map measurement method, the measurement method described in the reference, or the like is also used as a measurement method of the first electrode film 34a to be described later.

As shown in FIG. 9, the amplitude after application of heat is not attenuated when the tension stress of the PZT thin film 33 is 50 MPa or more and 500 MPa or less. In other words, the PZT thin film 33 with the tension stress of 50 MPa to 500 MPa has favorable heat resistance. In particular, the PZT thin film 33 with the tension stress of 100 MPa to 300 MPa has favorable heat resistance.

The reason why the PZT thin film 33 has favorable heat resistance when provided with the tension stress that is within the range described above is that a crystal lattice of the PZT is distorted to thus suppress a movement of domains.

As shown in FIG. 9, the amplitude after application of heat is attenuated when the tension stress of the PZT thin film 33 exceeds 500 MPa. This is probably because cracks increase due to the stress of the PZT thin film 33, and the distortion of the crystal lattice is thus eliminated. On the other hand, the amplitude after application of heat is attenuated when the tension stress is less than 50 MPa. This is probably because the movement of domains is facilitated since there is no distortion in crystal lattice due to a low stress of the PZT thin film 33.

Figure 10:
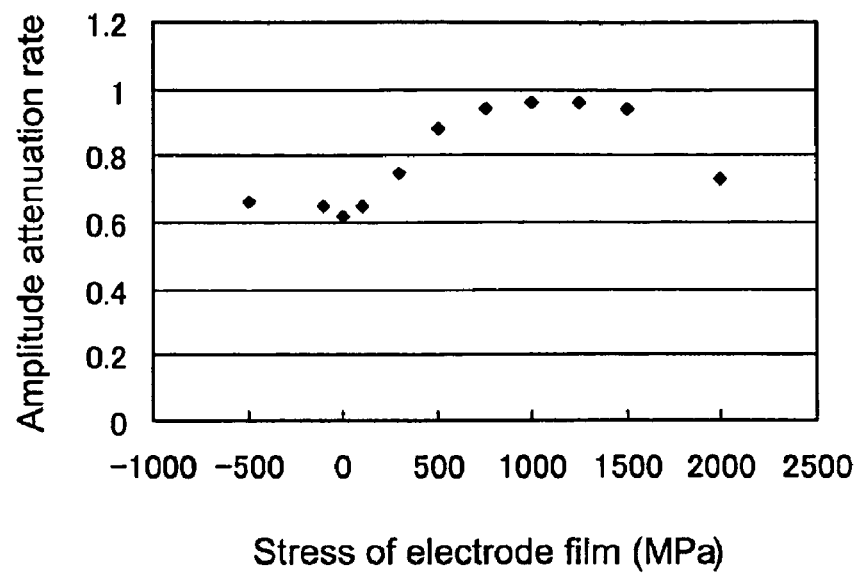
FIG. 10 is a diagram showing a relationship between a stress (−500 MPa to 2,000 MPa) of a first electrode film and the amplitude attenuation rate after application of heat.

FIG. 10 is a diagram showing a relationship between a stress (−500 MPa to 2,000 MPa) of the first electrode film 34a and the amplitude attenuation rate after application of heat. In this case, the tension stress of the PZT thin film 33 is 200 MPa. In addition, the heating temperature and heating time of the PZT thin film 33 are 240° C. and 90 s, respectively.

As shown in FIG. 10, the amplitude after application of heat is not attenuated when the tension stress of the first electrode film 34a is 500 MPa or more and 1,500 MPa or less. In other words, it can be seen that the piezoelectric device 139 including the first electrode film 34a with the tension stress of 500 MPa to 1,500 MPa has favorable heat resistance. In particular, it can be seen that when the first electrode film 34a has a tension stress of 700 MPa to 1,200 MPa, the PZT thin film 33 formed on the first electrode film 34a has favorable heat resistance.

The reason why the piezoelectric device 139 has favorable heat resistance when the first electrode film 34a is provided with the tension stress that is within the range described above is that a crystal lattice of the PZT thin film 33 is distorted to an appropriate degree by the tension stress of the first electrode film 34a, to thus suppress the movement of domains.

The amplitude after application of heat is attenuated when the tension stress of the first electrode film 34a exceeds 1,500 MPa. This is probably because cracks of the PZT thin film 33 increase by the tension stress of first electrode film 34a, and the distortion of the crystal lattice is thus eliminated. In this case, cracks have actually been observed on the surface of the PZT thin film 33. Moreover, a peeling has been observed between the first electrode film 34a having the tension stress of more than 1,500 MPa and the arm base 133.

On the other hand, the amplitude after application of heat is attenuated also when the tension stress of the first electrode film 34a is less than 500 MPa. This is probably because the movement of domains is facilitated since there is no distortion in crystal lattice due to a low stress of the first electrode film 34a.

Figure 11:
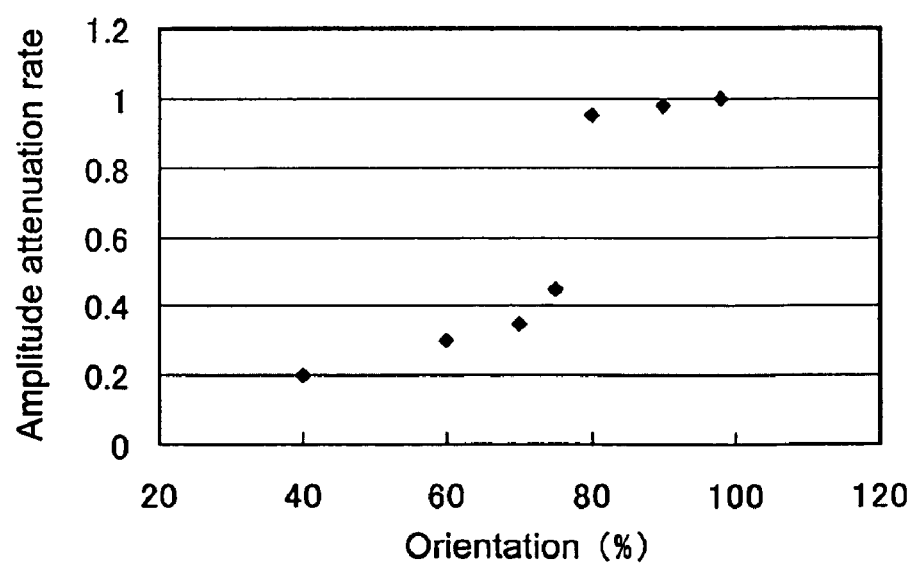
FIG. 11 is a diagram showing a relationship between an orientation degree of the PZT in a <111> surface direction and the amplitude attenuation rate of the vibration arm after application of heat.

FIG. 11 is a diagram showing a relationship between an orientation degree of the PZT in the <111> surface direction and the amplitude attenuation rate of the vibration arm 132 after application of heat. The PbO excessive composition ratio X and Zr composition ratio Y of the PZT thin film 33 are 0.04 and 0.48, respectively. It can be seen from FIG. 11 that when the orientation degree of the PZT in the <111> surface direction is 80% or more, the amplitude attenuation after application of heat hardly occurs, which implies excellent heat resistance. On the other hand, it can be seen that when the orientation degree of the PZT in the <111> surface direction is less than 80%, the amplitude attenuation after application of heat is apt to occur.

Next, descriptions will be given on relationships of the amplitude attenuation rate of the vibration arm 132 after application of heat with polarization processing conditions and prebake conditions. It should be noted that in FIGS. 12 to 15 in descriptions below, the PbO excessive composition ratio X and Zr composition ratio Y of the PZT thin film 33 are 0.04 and 0.48, respectively. Moreover, the heating temperature and heating time of the PZT thin film 33 are 240° C. and 90 s, respectively.

Figure 12:
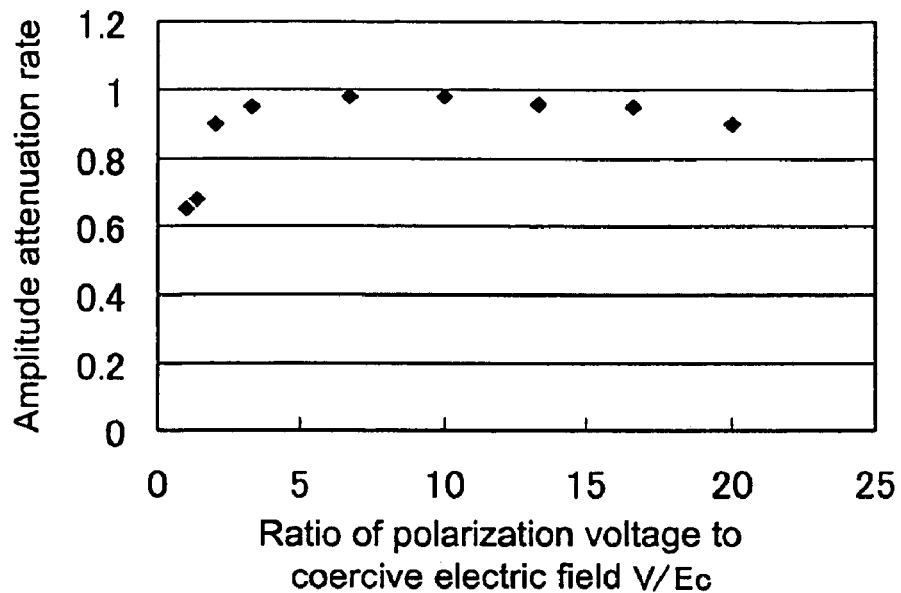
FIG. 12 is a diagram showing a relationship between a ratio of a polarization voltage in polarization processing with respect to a coercive electric field (1 to 20-times the coercive electric field $E_c$) and the amplitude attenuation rate of the vibration arm after application of heat.
Figure 13:
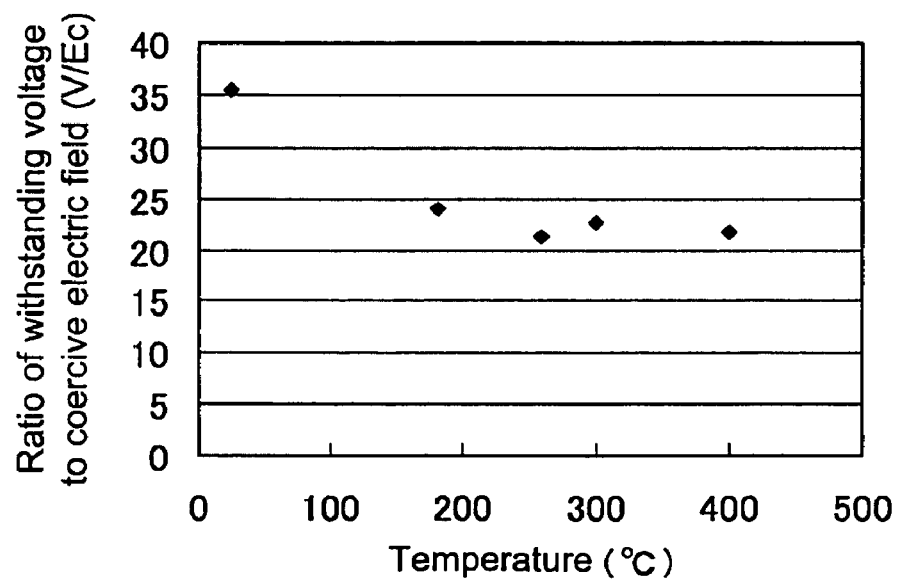
FIG. 13 is a diagram showing a relationship between a ratio of a withstanding voltage of the PZT thin film with respect to the coercive electric field and a polarization temperature.

FIG. 12 is a diagram showing a relationship between a ratio of a polarization voltage in the polarization processing with respect to a coercive electric field (1 to 20-times the coercive electric field $E_c$) and the amplitude attenuation rate of the vibration arm 132 after application of heat. As shown in FIG. 12, the amplitude attenuation after application of heat hardly occurs when the polarization voltage is 2 to 20-times the coercive electric field $E_c$, which implies excellent heat resistance. FIG. 13 shows a relationship between a ratio of a withstanding voltage of the PZT thin film 33 with respect to the coercive electric field and the polarization temperature. As shown in FIG. 13, an increase in polarization temperature leads to a decrease in ratio of the withstanding voltage of the PZT with respect to the coercive electric field. A dielectric breakdown of the PZT occurs when a polarization voltage that is 20-times or more the coercive electric field is applied to the PZT at the polarization temperature of 180° C. or more. Therefore, it can be seen that applying the polarization voltage that is 20-times or more the coercive electric field $E_c$ to the PZT is inappropriate, and an appropriate polarization voltage is a voltage that is 2 to 20-times the coercive electric field $E_c$.

Figure 14:
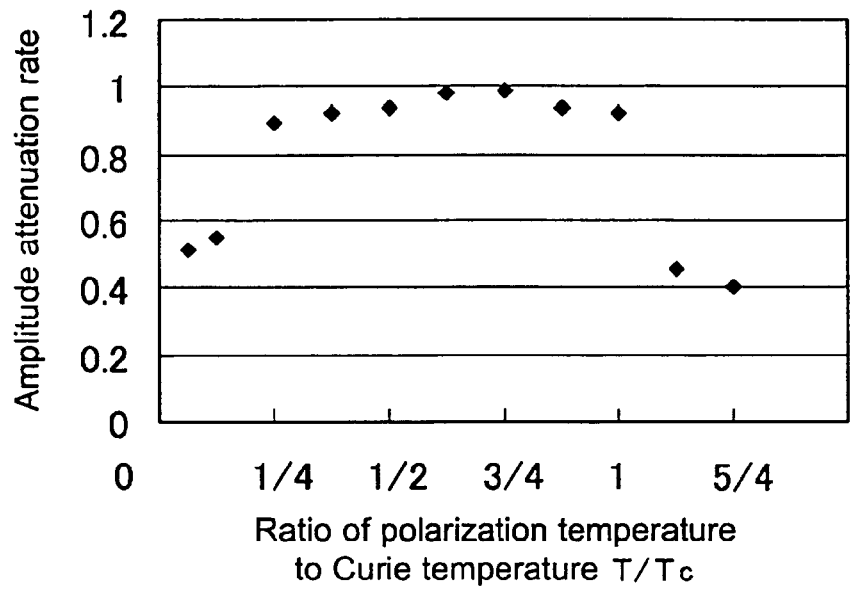
FIG. 14 is a diagram showing a relationship between a ratio of the polarization temperature in the polarization processing with respect to the Curie temperature ($1/16$ to $5/4$-times the Curie temperature $T_c$) and the amplitude attenuation rate after application of heat.

FIG. 14 is a diagram showing a relationship between a ratio of the polarization temperature in the polarization processing with respect to a Curie temperature ($\frac{1}{16}$ to $\frac{5}{4}$ the Curie temperature $T_c$) and the amplitude attenuation rate after application of heat. The polarization voltage is 6-times the coercive electric field $E_c$. As shown in FIG. 14, when the polarization temperature is ¼ or more and equal to or smaller than the Curie temperature $T_c$, the amplitude attenuation after application of heat hardly occurs, which implies excellent heat resistance. The reason why the amplitude attenuation is large when the polarization temperature is less than ¼ the Curie temperature $T_c$ is probably because, due to insufficient polarization processing, the movement of domains of the PZT thin film 33 is suppressed. On the other hand, the reason why the amplitude attenuation is large when the polarization temperature exceeds the Curie temperature $T_c$ is probably because, due to a cubic crystalline structure of the PZT thin film 33, the movement of domains is facilitated after the polarization processing.

Figure 15:
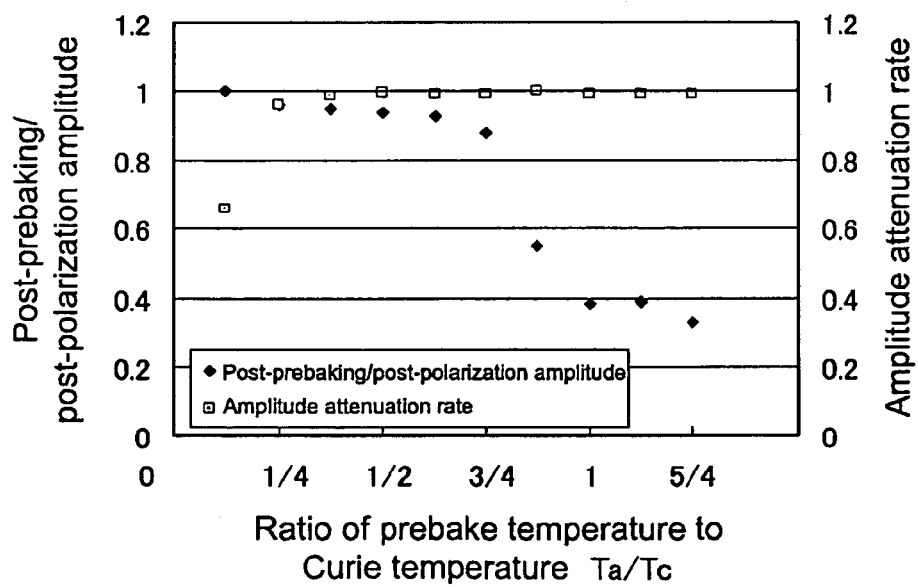
FIG. 15 is a diagram showing relationships of a ratio of a prebake temperature with respect to the Curie temperature ($1/2$ to $5/4$ the Curie temperature $T_c$), with the amplitude attenuation rate after application of heat and a post-baking/post-polarization amplitude attenuation rate.

FIG. 15 is a diagram showing relationships of a ratio of a prebake temperature Ta with respect to the Curie temperature (½ to 5/4 the Curie temperature $T_c$), with the amplitude attenuation rate after application of heat (abscissa axis and right-hand side ordinate axis) and a post-baking/post-polarization amplitude attenuation rate (abscissa axis and left-hand side ordinate axis).

Specifically, in FIG. 15, the amplitude attenuation rate in the prebake processing is evaluated by measuring the amplitude of the vibration arm 132 after the polarization processing, and re-measuring the amplitude of the vibration arm 132 after the prebake processing (½ to 5/4 the Curie temperature $T_c$) (abscissa axis and left-hand side ordinate axis). After that, heat that takes into account the heating processing at the time of manufacturing the device is applied to the PZT thin film 33 that has been subjected to the prebake processing, the amplitude of the vibration arm 132 after application of heat is measured, and the amplitude attenuation rate after application of heat is thus measured (abscissa axis and right-hand side ordinate axis). It should be noted that the polarization voltage is 6-times the coercive electric field $E_c$, and the polarization temperature is 260° C.

As shown in FIG. 15, it can be seen that when the prebake temperature Ta is ¾ or less the Curie temperature $T_c$, the amplitude of the vibration arm 132 after the prebake processing is not attenuated as much as that after the polarization processing. Moreover, it can be seen that when the prebake temperature Ta is ¼ or more the Curie temperature $T_c$, the amplitude after application of heat is not attenuated as much as that after the polarization processing, meaning that the piezoelectric device 139 has excellent heat resistance. Therefore, by setting the prebake temperature Ta in the prebake processing to be ¼ or more and ¾ or less the Curie temperature $T_c$, it becomes possible to obtain a piezoelectric device 139 with excellent heat resistance.

Second Embodiment

Next, a second embodiment will be described.

Figure 16:
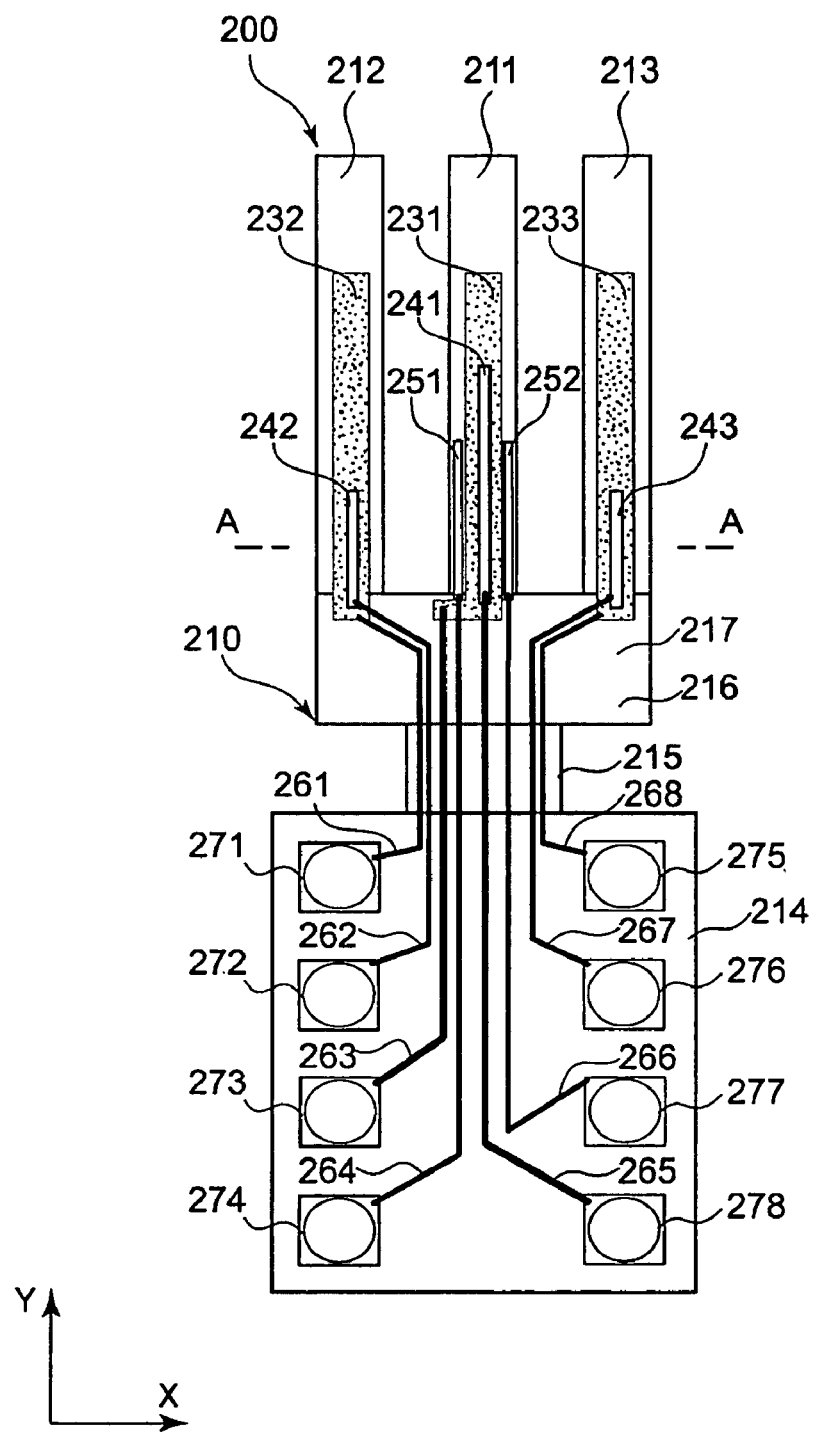
FIG. 16 is a plan diagram showing an angular velocity sensor according to a second embodiment.
Figure 17:
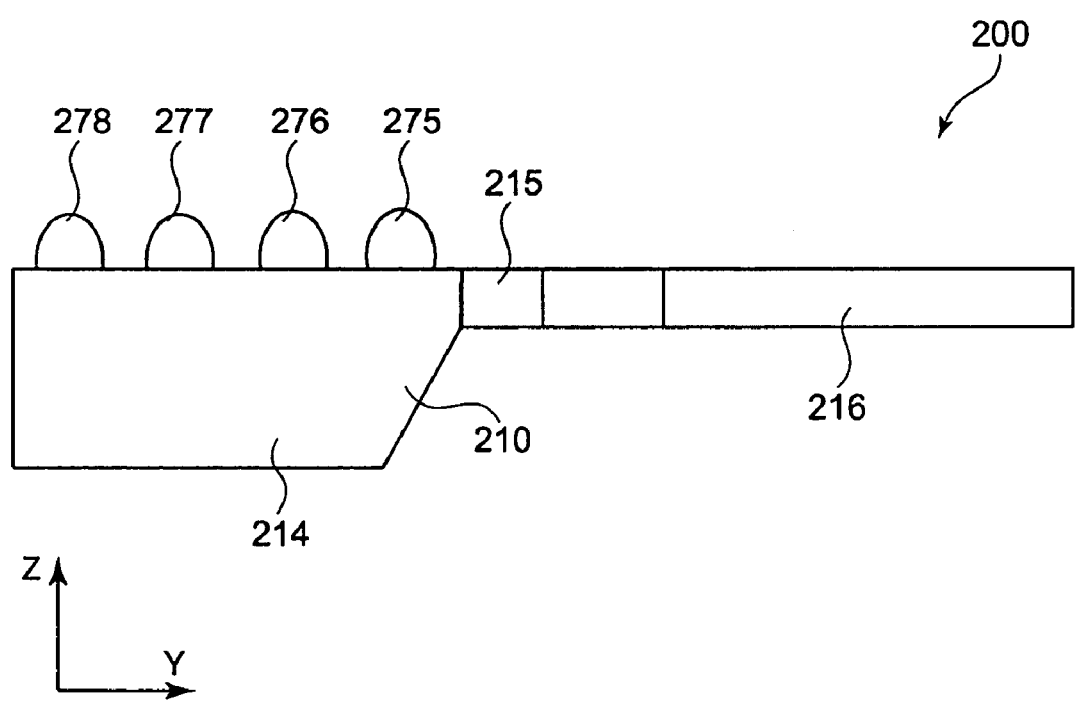
FIG. 17 is a schematic diagram of the angular velocity sensor shown in FIG. 16.
Figure 18:
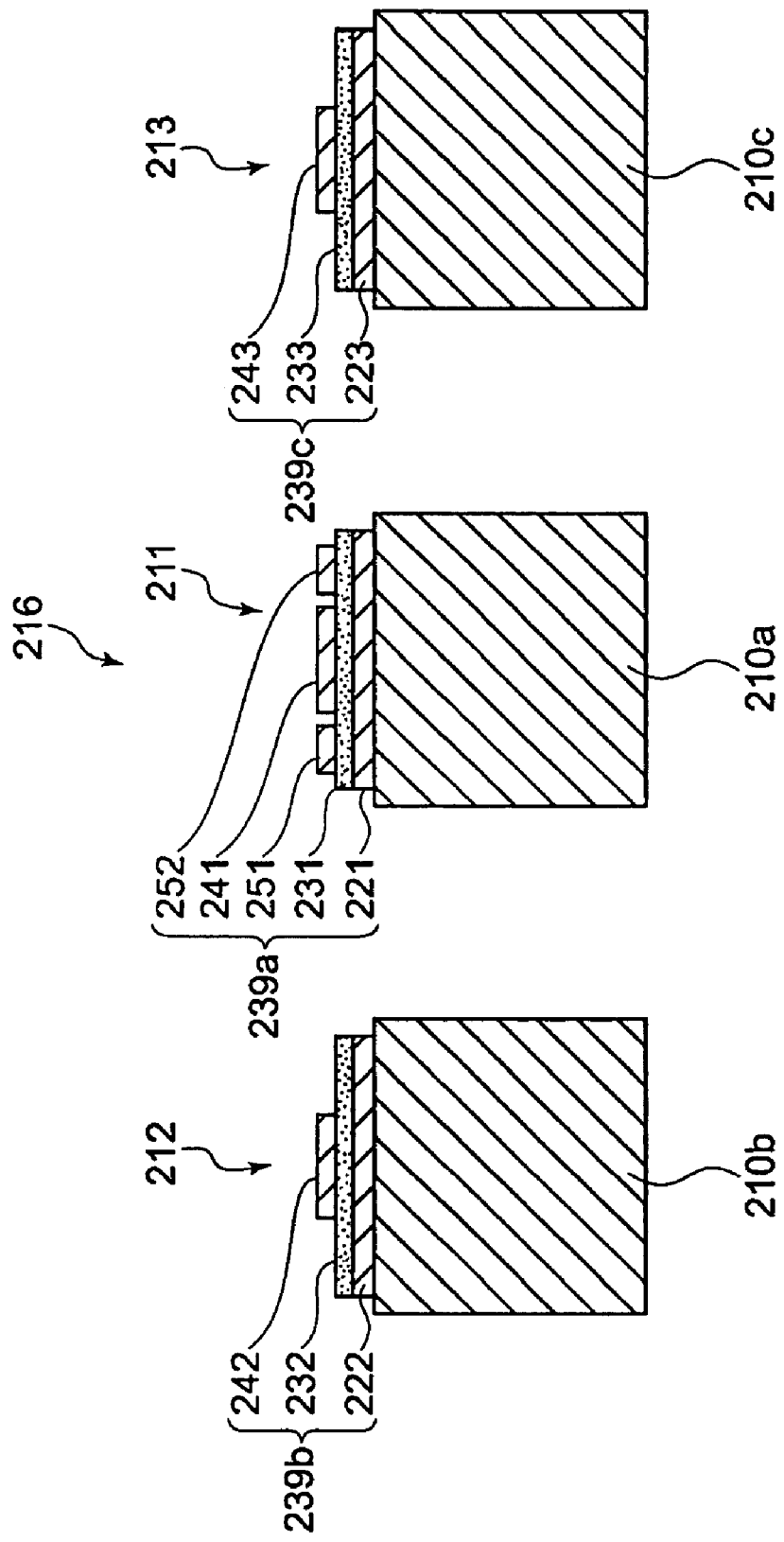
FIG. 18 is a cross-sectional diagram taken along the line A-A of FIG. 16.

FIG. 16 is a plan diagram showing an angular velocity sensor according to this embodiment. In addition, FIG. 17 is a schematic diagram of the angular velocity sensor according to this embodiment, and FIG. 18 is a cross-sectional diagram taken along the line A-A of FIG. 16.

As shown in the figures, an angular velocity sensor 200 includes a base body 214, an arm retention portion 215 provided on one side of the base body 214, and a vibration arm portion 216 provided on a tip end side of the arm retention portion 215.

The vibration arm portion 216 includes a first vibration arm 211, and second and third vibration arms 212 and 213 sandwiching the first vibration arm 211. The first vibration arm 211 is constituted of an arm base 210a and a piezoelectric device 239a formed thereon, the second vibration arm 212 is constituted of an arm base 210b and a piezoelectric device 239b formed thereon, and the third vibration arm 213 is constituted of an arm base 210c and a piezoelectric device 239c formed thereon. In other words, the angular velocity sensor 200 according to this embodiment is a so-called triple-branch tuning-fork type angular velocity sensor.

The first to third vibration arms 211 to 213 have the same width and thickness, for example. Moreover, a gap between the first and second vibration arms 211 and 212 and a gap between the first and third vibration arms 211 and 213 are the same.

As shown in FIG. 18, first electrode films 221 to 223 are respectively formed on the arm bases 210a to 210c, and PZT thin films 231 to 233 each as a piezoelectric film are respectively formed on the first electrode films 221 to 223. Further, second electrode films 241 to 243 each as a drive electrode are respectively formed on the PZT thin films 231 to 233. Moreover, a first detection electrode 251 and a second detection electrode 252 are formed on the piezoelectric thin film 231 of the first vibration arm 211 in the middle of the vibration arm portion 216.

A film thickness of each of the PZT thin films 231 to 233 and the PbO excessive composition ratio X and Zr composition ratio Y of the PZT are the same as that of the PZT thin film 33 according to the first embodiment. Further, the PZT thin films 231 to 233 each have a tension stress of the same level as the PZT thin film 33. Furthermore, the first electrode films 221 to 223 also have a tension stress of the same level as the first electrode film 34a of the first embodiment.

The plurality of electrodes 221 to 223, 241 to 243, 251, and 252 included in the respective piezoelectric devices 239 are respectively connected to lead wires 261 to 268. The lead wires 261 to 268 pass through a surface of the arm retention portion 215 to be respectively connected to lead terminals 271 to 278 provided on a surface of the base body 214. The lead terminals 271 to 278 are provided four each on both sides in an X direction on the surface of the base body 214.

Next, an operation of the angular velocity sensor 200 according to this embodiment will be described.

The first vibration arm 211 is caused of a flexion movement in the vertical direction of FIG. 18 when a voltage is applied to the first electrode film 221 and the second electrode film 241. Meanwhile, the second and third vibration arms 212 and 213 are caused of a flexion movement in the vertical direction at a phase opposite to that of the first vibration arm 211, when a voltage is applied to the first electrode films 222 and 223 and second electrode films 242 and 243.

Specifically, the second and third vibration arms 212 and 213 move downward when the first vibration arm 211 move upward, and the second and third vibration arms 212 and 213 move upward when the first vibration arm 211 move downward. Moreover, by the second and third vibration arms 212 and 213 being caused of the flexion movement at an amplitude half the amplitude of the first vibration arm 211, moments generated by the first to third vibration arms 211 to 213 are canceled out.

As a result of evaluating the piezoelectric devices 239 of the thus-structured angular velocity sensor 200 in the same manner as in FIGS. 2 to 15, it has been confirmed that each of the piezoelectric devices 239 has the same piezoelectric performance and heat resistance as the piezoelectric device 139 of the angular velocity sensor 31 according to the first embodiment.

It should be noted that although the second electrode films 241 to 243 for driving the respective vibration arms are provided to the respective vibration arms in this embodiment, it is also possible to form the second electrode film on only the first vibration arm 211, for example. In this case, the second and third vibration arms 212 and 213 vibrate at phases opposite to that of the first vibration arm 211 by a counteraction of the vibration of the first vibration arm 211.

Alternatively, it is also possible to form the second electrode films on only the second and third vibration arms 212 and 213. In this case, the first vibration arm 211 vibrates at a phase opposite to that of the second and third vibration arms 212 and 213 by a counteraction of the vibration of the second and third vibration arms 212 and 213.

The piezoelectric device and angular velocity sensor described above are not limited to the above embodiments, and various modifications can be made.

For example, in the deposition of the PZT thin film 33 above, although the PZT is formed so as to have an orientation in the <111> surface direction, the present application is not limited thereto, and the PZT may be deposited so as to have an orientation in a <100> surface direction or a <001> surface direction. Even when the PZT is deposited as described above, a piezoelectric device 139 with excellent piezoelectric characteristics and heat resistance can still be obtained.

In the above embodiments, descriptions have been given on the case where the crystalline structure of the PZT thin film 33 is tetragonal. However, the crystalline structure of the PZT thin film 33 may be rhombohedral, pseudo tetragonal, pseudo rhombohedral, or the like. Moreover, the PZT thin film 33 may include at least one of additive elements selected from the group consisting of Cr, Mn, Fe, Ni, Mg, Sn, Cu, Ag, Nb, Sb, and N.

Instead of the angular velocity sensor 31, the piezoelectric device 139 can also be applied to, for example, a pyroelectric infrared ray sensor, a liquid injection apparatus, a semiconductor storage apparatus, and the like. It should be noted that in this case, the piezoelectric device 139 only needs to be provided with at least one of the first and second electrode films, and the first and second detection electrodes do not necessarily need to be provided thereto.

The above embodiments respectively illustrate the so-called single-branch tuning-fork type angular velocity sensor 31 and triple-branch tuning-fork type angular velocity sensor 200. However, the number of vibration arms may be 2 or more than 3. Alternatively, although the angular velocity sensors 31 and 200 each have a cantilever structure, the sensors may each have a center impeller structure.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A piezoelectric device, comprising:
   a piezoelectric film constituted of lead zirconium titanate represented by $Pb_{1+X}(Zr_Y Ti_{1-Y})O_{3+X}$, where X is 0 or more and 0.3 or less and Y is 0 or more and 0.55 or less, the piezoelectric film having a tension stress ranging from 50 MPa or more and 500 MPa or less; and
   an electrode film that applies a voltage to the piezoelectric film.

2. The piezoelectric device according to claim 1, wherein the piezoelectric film has a film thickness of 400 nm or more and 1,000 nm or less.

3. The piezoelectric device according to claim 1, wherein the electrode film has a tension stress of 500 MPa or more and 1,500 MPa or less.

4. The piezoelectric device according to claim 1, wherein the piezoelectric film has an orientation of 80% or more in a <111> direction.

5. The piezoelectric device according to claim 1, wherein the piezoelectric film includes at least one of additive elements selected from the group consisting of Cr, Mn, Fe, Ni, Mg, Sn, Cu, Ag, Nb, Sb, and N.

6. The piezoelectric device according to claim 1, wherein the electrode film is formed of at least one of Ti and Pt.

7. A piezoelectric device, comprising:
 a piezoelectric film constituted of lead zirconium titanate represented by $Pb_{1+X}(Zr_Y Ti_{1-Y})O_{3+X}$, where X is 0 or more and 0.3 or less and Y is 0 or more and 0.55 or less; and
 an electrode film that has a tension stress of 500 MPa or more and 1,500 MPa or less and applies a voltage to the piezoelectric film.

8. The piezoelectric device according to claim 7, wherein the piezoelectric film has a film thickness of 400 nm or more and 1,000 nm or less.

9. The piezoelectric device according to claim 7, wherein the piezoelectric film has a tension stress of 50 MPa or more and 500 MPa or less.

10. The piezoelectric device according to claim 7, wherein the piezoelectric film has an orientation of 80% or more in a <111> direction.

11. The piezoelectric device according to claim 7, wherein the piezoelectric film includes at least one of additive elements selected from the group consisting of Cr, Mn, Fe, Ni, Mg, Sn, Cu, Ag, Nb, Sb, and N.

12. The piezoelectric device according to claim 7, wherein the electrode film is formed of at least one of Ti and Pt.

13. An angular velocity sensor, comprising:
 a substrate;
 a first electrode film formed on the substrate;
 a piezoelectric film constituted of lead zirconium titanate represented by $Pb_{1+X}(Zr_Y Ti_{1-Y})O_{3+X}$, where X is 0 or more and 0.3 or less and Y is 0 or more and 0.55 or less, the piezoelectric film having a tension stress ranging from 50 MPa or more and 500 MPa or less and formed on the first electrode film; and
 a second electrode film formed on the piezoelectric film.

14. An angular velocity sensor, comprising:
 a substrate;
 a first electrode film that has a tension stress of 500 MPa or more and 1,500 MPa or less and formed on the substrate;
 a piezoelectric film constituted of lead zirconium titanate represented by $Pb_{1-X}(Zr_Y Ti_{1-Y})P_{3+X}$, where X is 0 or more and 0.3 or less and Y is 0 or more and 0.55 or less, the piezoelectric film formed on the first electrode film; and
 a second electrode film formed on the piezoelectric film.

15. An angular velocity sensor, comprising:
 a substrate;
 a first electrode film formed on the substrate;
 a piezoelectric film constituted of lead zirconium titanate represented by $Pb_{1+X}(Zr_Y Ti_{1-Y})O_{3+X}$, where X is 0 or more and 0.3 or less and Y is 0 or more and 0.55 or less, the piezoelectric film having a film thickness of 400 nm or more and 1,000 nm or less, having a tension stress ranging from 50 MPa or more and 500 MPa or less, and formed on the first electrode film; and
 a second electrode film formed on the piezoelectric film.

* * * * *